US012601772B2

(12) United States Patent
Yuan et al.

(10) Patent No.: US 12,601,772 B2
(45) Date of Patent: Apr. 14, 2026

(54) ENERGY CONSUMPTION DECOMPOSITION METHOD OF ELECTRIC VEHICLE, ANALYSIS METHOD, SYSTEM, DEVICE AND MEDIUM

(71) Applicant: Jilin University, Changchun City (CN)

(72) Inventors: Xinmei Yuan, Changchun City (CN); Leqi Gu, Changchun City (CN); Yifan Ma, Changchun City (CN); Zhoulun Zhao, Changchun City (CN); Linghao Meng, Changchun City (CN); Fanzhuo Meng, Changchun City (CN); Jingfei Jiang, Changchun City (CN)

(73) Assignee: Jilin University, Changchun City (CN)

( * ) Notice: Subject to any disclaimer, the term of this patent is extended or adjusted under 35 U.S.C. 154(b) by 232 days.

(21) Appl. No.: 18/465,426

(22) Filed: Sep. 12, 2023

(65) Prior Publication Data

US 2024/0377441 A1      Nov. 14, 2024

(30) Foreign Application Priority Data

May 12, 2023      (CN) .......................... 202310537412.8

(51) Int. Cl.
*G01R 21/133*      (2006.01)
*B60L 3/00*      (2019.01)

(52) U.S. Cl.
CPC .......... *G01R 21/133* (2013.01); *B60L 3/0023* (2013.01)

(58) Field of Classification Search
CPC . G01R 21/133; B60L 3/0023; B60L 15/2045; B60L 2260/54; G06F 30/20; G06F 2119/06; G06F 2119/08; G06F 2119/14
See application file for complete search history.

(56) References Cited

U.S. PATENT DOCUMENTS

| | | | | |
|---|---|---|---|---|
| 5,896,083 A * | 4/1999 | Weisman, II | ........... | F16H 59/44 |
| | | | | 340/459 |
| 2010/0094496 A1* | 4/2010 | Hershkovitz | ........... | B60L 50/66 |
| | | | | 701/22 |
| 2010/0235030 A1* | 9/2010 | Xue | ........................ | B60L 50/16 |
| | | | | 180/65.21 |
| 2011/0257879 A1* | 10/2011 | Ishibashi | ............ | G01C 21/3469 |
| | | | | 701/533 |

(Continued)

*Primary Examiner* — Dale W Hilgendorf
*Assistant Examiner* — Frank T Glenn, III
(74) *Attorney, Agent, or Firm* — ROSSI, KIMMS & McDOWELL LLP

(57) ABSTRACT

An energy consumption decomposition method of an electric vehicle, an analysis method, a system, a device and a medium are provided, relating to the technical field of energy consumption monitoring of an electric vehicle. The energy consumption decomposition method includes: acquiring actual driving data of an electric vehicle to be analyzed during a trip; determining the trip energy consumption rate and driving features of the trip according to the actual driving data, where driving features of the trip are influenced by a trip factor and/or a driving behavior factor; and determining an energy consumption decomposition result of the electric vehicle according to driving features and the trip energy consumption rate, where the energy consumption decomposition result at least includes components of the energy consumption rate corresponding to driving features of the trip.

19 Claims, 7 Drawing Sheets

(56)                    References Cited

U.S. PATENT DOCUMENTS

| | | | |
|---|---|---|---|
| 2012/0111670 A1* | 5/2012 | Fargo | B66B 1/302 |
| | | | 187/247 |
| 2012/0316717 A1* | 12/2012 | Daum | B60L 55/00 |
| | | | 701/22 |
| 2013/0179007 A1* | 7/2013 | Dalum | H01M 10/48 |
| | | | 701/2 |
| 2014/0203927 A1* | 7/2014 | Petit | B60W 50/14 |
| | | | 340/439 |
| 2015/0375751 A1* | 12/2015 | Björkman | B60W 40/09 |
| | | | 701/22 |
| 2018/0297443 A1* | 10/2018 | Gibble | B60H 1/00842 |
| 2020/0240804 A1* | 7/2020 | Rao | G01C 21/3438 |
| 2022/0260378 A1* | 8/2022 | Hanchett | G01C 21/3461 |

* cited by examiner

ENERGY CONSUMPTION DECOMPOSITION METHOD OF ELECTRIC VEHICLE, ANALYSIS METHOD, SYSTEM, DEVICE AND MEDIUM

CROSS-REFERENCE TO RELATED APPLICATION

This patent application claims the benefit and priority of Chinese Patent Application No. 2023105374128filed with the China National Intellectual Property Administration on May 12, 2023, the disclosure of which is incorporated by reference herein in its entirety as part of the present application.

TECHNICAL FIELD

The present disclosure relates to the technical field of energy consumption monitoring of an electric vehicle, in particular to an energy consumption decomposition method of an electric vehicle, an analysis method, a system, a device and a medium.

BACKGROUND

By 2020, the stock of electric vehicles in the whole world have exceeded 10 million. Due to the limitation of the driving range, effective energy saving is particularly important for users of electric vehicles.

Studies at home and abroad point out that awareness of energy consumption is an important means of energy saving, and energy can be saved by more than 10% when users are aware of the main sources of energy consumption. However, at present, there is no way to decompose and trace the trip energy consumption of the electric vehicle.

SUMMARY

The present disclosure aims to provide an energy consumption decomposition method of an electric vehicle, an analysis method, a system, a device and a medium, which can comprehensively analyze the energy consumption decomposition of vehicles, so that users know the degree to which the trip factor and the driving behavior factor influence energy consumption, so as to achieve the purpose of energy saving.

In order to achieve the above objectives, the present disclosure provides the following solutions.

In a first aspect, the present disclosure provides an energy consumption decomposition method of an electric vehicle, comprising:

acquiring actual driving data of an electric vehicle to be analyzed during a trip, where the actual driving data includes curb weight, load mass, trip route information and total trip energy consumption, and the trip route information includes position data and speed data;

determining a trip energy consumption rate and driving features of the trip in the actual driving data, where driving features of the trip are influenced by a trip factor and/or a driving behavior factor; and determining an energy consumption decomposition result of the electric vehicle according to driving features and the trip energy consumption rate, where the energy consumption decomposition result at least includes components of the energy consumption rate corresponding to driving features in the trip.

In some embodiments, the driving features of the trip include load intensity, climbing intensity, speed intensity, high-speed braking intensity, low-speed braking intensity, HVAC usage intensity and slow-driving intensity; or, the driving features of the trip include load intensity, climbing intensity, speed intensity, high-speed braking intensity, low-speed braking intensity and slow-driving intensity;

where the driving features of load intensity, high-speed braking intensity, low-speed braking intensity, HVAC usage intensity and slow-driving intensity are influenced by driving behavior factors; the driving feature of climbing intensity is influenced by the trip factor; and the driving feature of speed intensity is influenced by the trip factor and the driving behavior factor.

In some embodiments, the energy consumption decomposition result includes a rolling-loss-associated component of energy consumption rate, an aerodynamic-loss-associated component of the energy consumption rate, a high-speed-braking-loss-associated component of the energy consumption rate, a low-speed-braking-loss-associated component of the energy consumption rate, an ancillary-loss-associated component of the energy consumption rate, an altitude-change-associated component of the energy consumption rate, and an HVAC-operation-associated component of the energy consumption rate; where the rolling-loss-associated component of the energy consumption rate is determined according to the load intensity and a weight coefficient corresponding to the load intensity; the aerodynamic-loss-associated component of the energy consumption rate is determined according to the speed intensity and a weight coefficient corresponding to the speed intensity; the high-speed-braking-loss-associated component of energy consumption rate is determined according to the high-speed braking intensity and a weight coefficient corresponding to the high-speed braking intensity; the low-speed-braking-loss-associated component of energy consumption rate is determined according to the low-speed braking intensity and a weight coefficient corresponding to the low-speed braking intensity; the ancillary-associated component of energy consumption rate is determined according to the slow-driving intensity and a weight coefficient corresponding to the slow-driving intensity; the altitude-change associated component of the energy consumption rate is determined according to the climbing intensity and a weight coefficient corresponding to the climbing intensity; the HVAC-operation-associated component of the energy consumption rate is determined according to the HVAC usage intensity and a weight coefficient corresponding to the HVAC usage intensity, if the driving features include the HVAC usage intensity; and the HVAC operation-associated component of the energy consumption rate is obtained by subtracting the component of energy consumption rate corresponding to each driving feature of the trip from the trip energy consumption rate, if the driving features of the trip do not include the HVAC usage intensity.

In other words, in case of having the calibrated weight coefficient corresponding to HVAC usage intensity, the HVAC-operation-associated component of the energy consumption rate is determined according to the HVAC usage intensity and a weight coefficient corresponding to the HVAC usage intensity, and in case of not having the calibrated weight coefficient corresponding to HVAC usage intensity, the HVAC-operation associated component of the energy consumption rate may be determined by subtracting other components of the energy consumption rate from the trip energy consumption rate.

In some embodiments, the weight coefficient is obtained through a parameter learning experiment of an energy consumption decomposition algorithm; the parameter learning experiment of the energy consumption decomposition algorithm includes: determining an actual driving data and the total trip energy consumption of an experimental electric vehicle in each experimental test of a laboratory test and an actual road driving test through a laboratory test or an actual road driving test, where the actual driving data in the experimental test is experimental driving data, and in the laboratory test or the actual road driving test, when the experimental electric vehicle has test conditions under high temperature and low temperature, the weight coefficient corresponding to the HVAC usage intensity is learned. In other words, in case of not having test conditions under high temperature and low temperature, the weight coefficient corresponding to the HVAC usage intensity may not be learned;

calculating the trip energy consumption rate and driving features of the trip in the experimental driving data;

determining coefficients corresponding to the explanatory variables in an energy consumption model by using linear regression, with the trip energy consumption rate in experimental tests as observations of a response in the energy consumption model, and the driving features in the experimental tests as observations of explanatory variables in the energy consumption model, where the coefficients corresponding to various determined explanatory variables are weight coefficients of the corresponding driving features of the trip, respectively.

In a second aspect, the present disclosure provides an energy consumption decomposition system of an electric vehicle, comprising:

an actual driving data acquiring module, which is configured to acquire actual driving data of an electric vehicle to be analyzed during a trip, where the actual driving data includes curb weight, load mass, trip route information and total trip energy consumption, and the trip route information includes position data and speed data;

a trip energy consumption rate and driving feature calculation module, which is configured to determine a trip energy consumption rate and driving features of a trip in the actual driving data, where driving features of the trip are influenced by single factor or multiple factors, the single factor includes a trip factor or a driving behavior factor, and the multiple factors include a trip factor and a driving behavior factor;

an energy consumption decomposition result determining module, which is configured to determine an energy consumption decomposition result of the electric vehicle according to each driving feature and the trip energy consumption rate, where the energy consumption decomposition result at least includes components of the energy consumption rate corresponding to driving features of the trip.

In a third aspect, the present disclosure provides an energy consumption analysis method of an electric vehicle, comprising:

executing the energy consumption decomposition method of the electric vehicle according to the first aspect, and determining an energy consumption source corresponding to each component of the energy consumption rate.

In some embodiments, the energy consumption analysis method of the electric vehicle further includes: determining a target component of the energy consumption rate from the decomposition results, and the energy consumption source and an energy-saving measure corresponding to the target component of the energy consumption rate, where the target component of the energy consumption rate is a component of the energy consumption rate determined by subjective analysis based on an energy consumption rate proportion or a cumulative distribution function of each component of the energy consumption rate in combination with application scenarios; or, the target component of the energy consumption rate is a component of the energy consumption rate determined by subjective analysis based on each component of the energy consumption rate in combination with application scenarios.

In some embodiments, the energy consumption decomposition result includes the rolling-loss-associated component of the energy consumption rate, the aerodynamic-loss-associated component of the energy consumption rate, the high-speed-braking-loss-associated component of the energy consumption rate, the low-speed-braking-loss-associated component of the energy consumption rate, the ancillary-loss-associated component of the energy consumption rate, the altitude-change-associated component of the energy consumption rate, and the HVAC-operation-associated component of the energy consumption rate; where the energy consumption source corresponding to the rolling-loss-associated component of the energy consumption rate includes an electric vehicle load and/or electric vehicle tires; the energy consumption source corresponding to the aerodynamic-loss-associated component of the energy consumption rate includes at least one of wind speed, vehicle aerodynamic resistance and vehicle speed during driving of the electric vehicle; the energy consumption source corresponding to the high-speed-braking-loss-associated component of the energy consumption rate includes braking operation during high-speed driving of the electric vehicle; the energy consumption source corresponding to the low-speed-braking-loss-associated component of the energy consumption rate includes braking operation during low-speed driving of the electric vehicle; the energy consumption source corresponding to the ancillary-loss-associated component of the energy consumption rate includes idle duration of the electric vehicle and/or ancillary power (or operation of the ancillary used appliances); the energy consumption sources corresponding to the altitude change-associated component of the energy consumption rate includes altitude change during driving of the electric vehicle; the energy consumption source corresponding to the HVAC operation-associated component of the energy consumption rate includes at least one of HVAC power of the electric vehicle, HVAC operation (such as HVAC on/off set operation) of a driver and ambient temperature.

In some embodiments, the energy consumption decomposition result includes a rolling-loss-associated component of the energy consumption rate, an aerodynamic-loss associated component of the energy consumption rate, a high-speed-braking-loss-associated component of the energy consumption rate, a low-speed-braking-loss-associated component of the energy consumption rate, an ancillary-loss-associated component of the energy consumption rate, an altitude-change-associated component of the energy consumption rate, and an HVAC-operation-associated component of the energy consumption rate; where an energy-saving measure corresponding to the rolling-loss-associated component of energy consumption rate includes at least one of reducing load, reducing loading hours and using low rolling resistance tires; an energy-saving measure corresponding to the aerodynamic loss-associated component of the energy consumption rate includes slowing down high speed driving and/or optimizing vehicle aerodynamic resistance; an energy-saving measure corresponding to the high-speed-braking-loss-associated component of the energy consumption rate includes reducing or slowing down braking operation at high speed; an energy-saving measure corresponding to the low-speed-braking-loss-associated component of the energy consumption rate includes reducing and slowing down braking operation at low speed and/or optimizing a trip route of the electric vehicle; an energy-saving measure corresponding to the ancillary-loss-associated component of the energy consumption rate includes reducing idle duration of the electric vehicle and/or reducing a usage frequency and usage duration of a high-power accessory; an energy-saving measure corresponding to the altitude-change-associated component of the energy consumption rate includes optimizing the trip route of the electric vehicle; an energy-saving measure corresponding to the HVAC-operation-associated component of the energy consumption rate includes reducing operating hours of the HVAC and/or reducing a set temperature of the HVAC.

In a fourth aspect, the present disclosure provides an energy consumption analysis system of an electric vehicle, comprising:

an executing module, which is configured to execute the energy consumption decomposition method of the electric vehicle according to the first aspect;

an energy consumption source determining module, which is configured to determine an energy consumption source corresponding to each component of the energy consumption rate.

In a fifth aspect, the present disclosure provides an electronic device, comprising a memory and a processor, where the memory is configured to store a computer program, and the processor runs the computer program so that the electronic device executes the energy consumption decomposition method of the electric vehicle according to the first aspect or the energy consumption analysis method of the electric vehicle according to the third aspect.

In a sixth aspect, the present disclosure provides a computer-readable storage medium, where a computer program is stored therein, the computer program, when executed by a processor, implements the energy consumption decomposition method of the electric vehicle according to the first aspect or the energy consumption analysis method of the electric vehicle according to the third aspect.

According to the specific embodiment provided by the present disclosure, the present disclosure discloses the following technical effects.

According to the present disclosure, the internal parameters and internal variables of the vehicle do not need to be additionally acquired, and the energy consumption decomposition of the vehicle can be comprehensively analyzed only through the actual driving data of the electric vehicle and the data analysis algorithm, so that the user can know, by the components of the energy consumption rate, the degree to which the trip factor and the driving behavior factor influence the energy consumption, thereby achieving the purpose of energy saving. The method is simple and can be readily achieved.

BRIEF DESCRIPTION OF THE DRAWINGS

In order to explain the embodiments of the present disclosure or the technical scheme in the prior art more clearly, the drawings that need to be used in the embodiments will be briefly introduced hereinafter. Apparently, the drawings in the following description are only some embodiments of the present disclosure. For those skilled in the art, other drawings can be obtained according to these drawings without any creative effort.

DETAILED DESCRIPTION OF THE EMBODIMENTS

The technical scheme in the embodiment of the present disclosure will be clearly and completely described hereinafter with reference to the attached drawings. Apparently, the described embodiments are only part of the embodiments of the present disclosure, rather than all of the embodiments. Based on the embodiment of the present disclosure, all other embodiments obtained by those skilled in the art without any creative effort belong to the scope of protection of the present disclosure.

Figure 1:
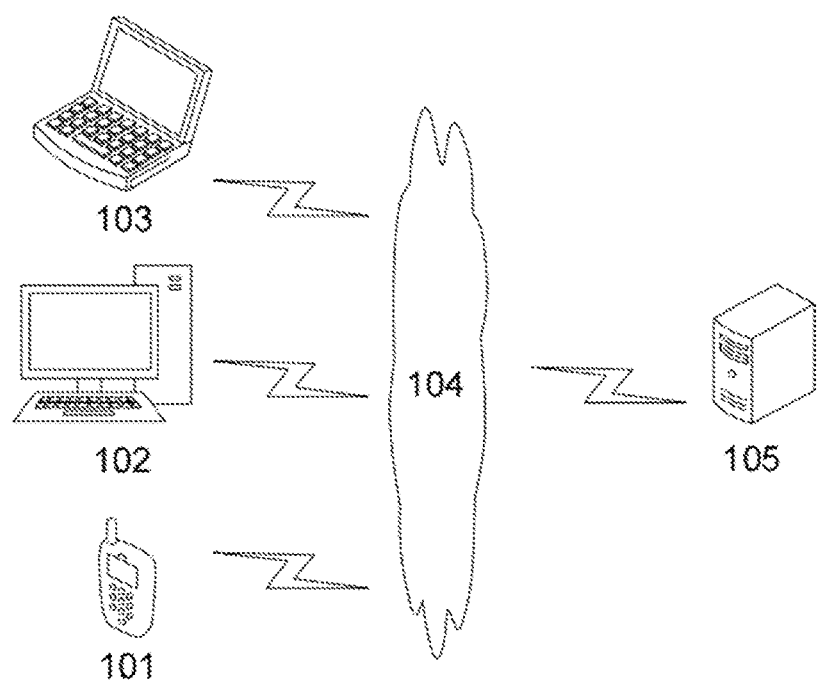
FIG. 1 is an exemplary system architecture diagram to which an embodiment of the present disclosure can be applied.

In order to make the above objectives, features and advantages of the present disclosure more obvious and understandable, the disclosure will be further described in detail in conjunction with the attached drawings and detailed description. FIG. 1 shows an exemplary architecture 100 of an energy consumption decomposition method of an electric vehicle, an analysis method, a system, a device and a medium to which the present disclosure can be applied.

As shown in FIG. 1, the system architecture 100 may include a terminal device 101, a terminal device 102, a terminal device 103, a network 104 and a server 105. The communication connection among the terminal device 101, the terminal device 102 and the terminal device 103 constitutes a topological network. The network 104 is used to provide a medium for a communication link among the terminal device 101, the terminal device 102, the terminal device 103 and the server 105. The network 104 may include various connection types, such as wired, wireless communication links or fiber optic cables.

The user can interact with the server 105 through the network 104 using the terminal device 101, the terminal device 102 and the terminal device 103 to receive or send messages, etc. The terminal device 101, the terminal device 102, and the terminal device 103 may be hardware devices or software supporting network connection for data interaction and data processing. When the terminal device 101, the terminal device 102 and the terminal device 103 are hardware, they can be various electronic devices supporting network connection, information acquisition, interaction, display, processing and other functions, including but not limited to smart phones, tablet computers, e-book readers, laptop computers, desktop computers, vehicle-mounted terminals, etc. If the terminal device 101, the terminal device 102 and the terminal device 103 are software, they can be installed in the electronic devices listed above. The terminal devices can be implemented as a plurality of software or software modules for providing distributed services, for example, or as a single software or software module, which is not specifically defined here.

The server 105 may be a server which provide various services, for example, acquiring, in response to receiving an electric vehicle energy consumption decomposition request or an analysis request sent by the terminal device 101, the terminal device 102 and the terminal device 103, actual driving data of an electric vehicle to be analyzed during a trip, determining, in the actual driving data, the trip energy consumption rate and driving features of the trip, determining an energy consumption decomposition result of the electric vehicle according to driving features and the trip energy consumption rate, and determining the energy consumption source corresponding to each component of the energy consumption rate. As an example, the server 105 may be a cloud server.

It should be noted that the server can be hardware or software. When the server is hardware, the server can be realized as a distributed server cluster consisted of a plurality of servers or as a single server. When the server is software, the server can be implemented as a plurality of software or software modules (for example, the software or software modules configured to provide distributed services) or as a single software or software module, which is not specifically defined here.

It should also be noted that the energy consumption decomposition method of the electric vehicle and the energy consumption analysis method of the electric vehicle according to the embodiment of the present application can be executed by the server, be executed by the terminal device, or be executed by the server and the terminal device cooperating with each other. Accordingly, all parts (such as all modules) included in the energy consumption decomposition system of the electric vehicle and the energy consumption analysis system of the electric vehicle can be all provided in the server, be all provided in the terminal device, or be provided in the server and the terminal device separately.

It should be understood that the number of terminal devices, networks and servers in FIG. 1 is only schematic. There can be any number of terminal devices, networks and servers according to implementation requirements. When the electronic device on which the energy consumption decomposition method of the electric vehicle and the energy consumption analysis method of the electric vehicle run does not need to communicate data with other electronic devices, the system architecture may only include the electronic device (such as the server or the terminal device) on which the energy consumption decomposition method of the electric vehicle and the energy consumption analysis method of the electric vehicle run.

Figure 2:
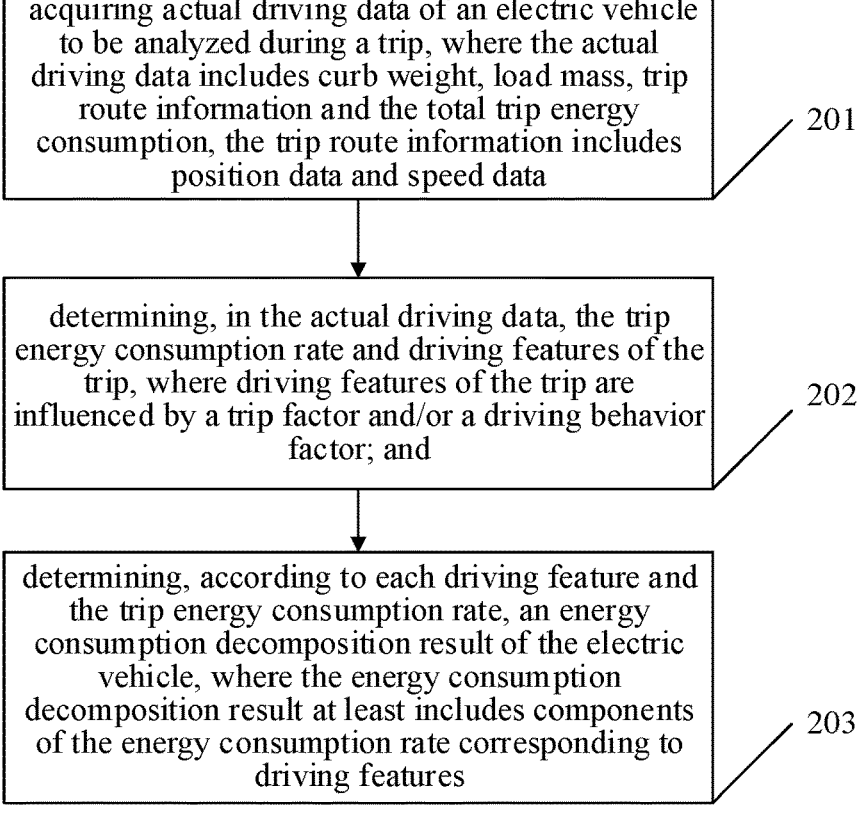
FIG. 2 is a flowchart of an embodiment of an energy consumption decomposition method of an electric vehicle according to the present disclosure.

Continue to refer to FIG. 2, which shows a flow 200 of an embodiment of an energy consumption decomposition method of an electric vehicle, including the following steps:

Step 201: acquiring actual driving data of an electric vehicle to be analyzed during a trip, where the actual driving data includes curb weight, load mass, trip route information and the total trip energy consumption, the trip route information includes position data and speed data, and the position data at least includes a horizontal distance and an altitude distance;

Step 202: determining, in the actual driving data, the trip energy consumption rate and driving features of the trip, where driving features of the trip are influenced by a trip factor and/or a driving behavior factor; and Step 203: determining, according to each driving feature and the trip energy consumption rate, an energy consumption decomposition result of the electric vehicle, where the energy consumption decomposition result at least includes components of the energy consumption rate corresponding to driving features.

In this embodiment, the execution entity (for example, the terminal device or the server in FIG. 1) of the energy consumption decomposition method of the electric vehicle can remotely or locally acquire the actual driving data of the electric vehicle to be analyzed during a trip through wired network connection or wireless network connection.

In some alternative implementations of this embodiment, the driving features of the trip include load intensity, climbing intensity, speed intensity, high-speed braking intensity, low-speed braking intensity, HVAC (Heating Ventilation and Air Conditioning) usage intensity and slow-driving intensity; alternatively, the plurality of driving features of the trip include load intensity, climbing intensity, speed intensity, high-speed braking intensity, low-speed braking intensity and slow-driving intensity.

The driving features of load intensity, high-speed braking intensity, low-speed braking intensity, HAVC usage intensity and slow-driving intensity are influenced by a driving behavior factor; the driving feature of climbing intensity is influenced by a trip factor; and the driving feature of speed intensity is influenced by the trip factor and the driving behavior factor.

In some alternative implementations of this embodiment, the energy consumption decomposition result includes the rolling-loss-associated component of the energy consumption rate, the aerodynamic-loss-associated component of the energy consumption rate, the high-speed-braking-loss-associated component of the energy consumption rate, the low-speed braking-loss-associated component of the energy consumption rate, the ancillary-loss-associated component of the energy consumption rate, the altitude-change-associated component of the energy consumption rate, and the HVAC-operation-associated component of the energy consumption rate.

The rolling-loss-associated component of the energy consumption rate is determined according to the load intensity and the weight coefficient corresponding to the load intensity; the aerodynamic-loss-associated component of the energy consumption rate is determined according to the speed intensity and the weight coefficient corresponding to the speed intensity; the high-speed-braking-loss-associated component of the energy consumption rate is determined according to the high-speed braking intensity and the weight coefficient corresponding to the high-speed braking intensity; the low-speed-braking-loss component of the energy consumption rate is determined according to the low-speed braking intensity and the weight coefficient corresponding to the low-speed braking intensity; the ancillary-loss-associated component of the energy consumption rate component is determined according to the slow-driving intensity and the weight coefficient corresponding to the slow-driving intensity; the altitude-change-associated component of the energy consumption rate is determined according to the climbing intensity and the weight coefficient corresponding to the climbing intensity; when the driving features of the trip include the HVAC usage intensity, the HVAC-operation-associated component of the energy consumption rate is determined according to the HVAC usage intensity and the weight coefficient corresponding to the HVAC usage intensity; and when the driving features of the trip do not include the HVAC usage intensity, the HVAC-operation-associated component of the energy consumption rate is obtained by subtracting the component of the energy consumption rate corresponding to each driving feature of the trip from the trip energy consumption rate.

As an example, the weight coefficient is obtained through a parameter learning experiment of an energy consumption decomposition algorithm.

The parameter learning experiment of the energy consumption decomposition algorithm includes:

(1) determining the actual driving data and the total trip energy consumption in each experimental test of an experimental electric vehicle in a laboratory test and an actual road driving test through a laboratory test or an actual road driving test, where the actual driving data in the experimental test is experimental driving data, and in the laboratory test or the actual road driving test, when the experimental electric vehicle has the test conditions of high temperature and low temperature, the weight coefficient corresponding to the HVAC usage intensity is learned;

(2) calculating the trip energy consumption rate and driving features of the trip in the experimental driving data;

(3) by taking the trip energy consumption rate in a plurality of experimental tests as observations of a response in an energy consumption model, taking the driving features of a plurality of experimental tests as observations of a plurality of explanatory variables in the energy consumption model, determining the coefficients corresponding to the respective dependent variables in the energy consumption model by using linear regression, where the determined coefficients corresponding to the respective explanatory variables are weight coefficients of the corresponding driving features of the trip, respectively.

The determination process for the above weight coefficients will be explained in detail below through a specific example.

Through the laboratory test or the actual road driving test, the energy consumption model parameters (i.e. weight coefficient parameters) that meet the formula (1) are learned, that is, $\beta_w$, $\beta_g$, $\beta_{spd}$, $\beta_{H\text{-}brk}$, $\beta_{L\text{-}brk}$, $\beta^{slw}$ and $\beta_{AC}$.

$$ECR = \beta_w * I_0 + \beta_g * I_g + \beta_{spd} * I_{spd} + \tag{1}$$
$$\beta_{H-brk} * I_{H-brk} + \beta_{L-brk} * I_{L-brk} + \beta_{slw} * I_{slw} + \beta_{AC} * I_{AC}$$

where ECR is the energy consumption rate of the vehicle per unit trip, $\beta_w$, $\beta_g$, $\beta_{spd}$, $\beta_{H\text{-}brk}$, $\beta_{L\text{-}brk}$, $\beta_{AC}$ and $\beta_{slw}$ are constant model parameters (weight coefficients), and $I_0$, $I_g$, $I_{spa}$, $I_{H\text{-}brk}$, $I_{L\text{-}brk}$, $I_{slw}$ and $I_{Ac}$ are the explanatory variables describing trip factors and driving behavior factors, which are referred to as load intensity, climbing intensity, speed intensity, high-speed braking intensity, low-speed braking intensity, HVAC usage intensity and slow-driving intensity. It should be noted that when the experimental electric vehicle has the test conditions of high temperature and low temperature, the weight coefficient corresponding to the HVAC usage intensity is learned. In other words, the weight coefficient corresponding to the HVAC usage intensity may not be determined in the absence of high and low temperature test environment.

The specific calculation is as follows:

Load intensity:

$$I_0 = \frac{m}{m_0} \cdot \frac{D_{hor,trip}}{D_{trip}} \tag{2}$$

Climbing intensity:

$$I_g = \frac{m}{m_0} \cdot \frac{D_{ver,trip}}{D_{trip}} \tag{3}$$

Speed intensity:

$$I_{spd} = \frac{\sum_{i=1}^{n-1} \bar{v}(i)^3}{\sum_{i=1}^{n-1} \bar{v}(i)} \tag{4}$$

High-speed braking intensity:

$$I_{H-brk} = \frac{\sum_{\substack{i=1 \\ v(1) \geqslant v_{th}}}^{n-1} E_{brk}(i)}{t_s \sum_{i=1}^{n-1} \bar{v}(i)} \tag{5}$$

Low-speed braking intensity:

$$I_{L-brk} = \frac{\sum\limits_{\substack{i=1 \\ v(1)<v_{th}}}^{n-1} E_{brk}(i)}{t_s \sum\limits_{i=1}^{n-1} \overline{v}(i)} \tag{6}$$

HVAC usage intensity:

$$I_{AC} = \frac{|T_{set} - T_{env}| \sum_{i \in ACon} t_s}{D_{trip}} \tag{7}$$

Slow-driving braking intensity:

$$I_{slw} = \frac{1}{\overline{v}_{trip}} \tag{8}$$

where $m_0$ is the curb weight, m is the load mass, n is the number of sampling points in the trip, $\overline{v}_{trip}$ is the average speed in the trip, $D_{trip}$ is the driving distance of the trip, $D_{hor,trip}$ is the horizontal distance of the trip, $D_{ver,trip}$ is the altitude change of the trip (where the position data includes $D_{trip}$ which is the driving distance of the trip, $D_{hor,trip}$ which is the horizontal distance of the trip, and $D_{ver,trip}$ which is the altitude change of the trip), $\overline{v}(i)$ is the average speed of a sampling interval; $T_{set}$ is the set temperature of a cabin, $T_{env}$ is the ambient temperature, and the condition i 68 AC on of $\Sigma$ of formula (7) is the HVAC being in ON state, $E_{brk}(i)$ is the sum of electromagnetic braking and mechanical braking energy in a sampling period, $v_{th}$ is the speed threshold for distinguishing between high-speed braking and low-speed braking, $t_s$ is the sampling interval, and $E_{brk}(i)$ can be acquired in different manners, including: directly calculating by obtaining braking force data from a vehicle bus, or estimating by using loss of vehicle kinetic energy in a sampling period, etc. The physical concept of braking energy is clear and can be obtained by any physical and reasonable means. The following are three methods of estimating $E_{brk}(i)$ by using the kinetic energy loss of the vehicle in a sampling period.

1) Formula (8) is used, which is suitable if road gradient is not considered.

$$E_{brk}(i) = \max\left( (m+m_0)\frac{v(i)^2 - v(i-1)^2}{2}, 0 \right) \tag{9}$$

2) Formula (9) is used for estimation, which is suitable if road gradient is not considered, but the castdown road load coefficients A, B and C of the vehicle need to be acquired in advance.

$$E_{brk}(i) = \max\left( (m+m_0)\frac{v(i)^2 - v(i-1)^2}{2} - \right. \tag{10}$$

-continued $$At_s \frac{v(i)+v(i+1)}{2} - Bt_s \cdot \frac{v(i)^2 + v(i+1)^2 + v(i)v(i+1)}{3} -$$

$$\left. Ct_s \cdot \frac{v(i)^3 + v(i)^2 v(i+1) + v(i)v(i+1)^2 + v(i+1)^3}{4}, 0 \right)$$

3) Formula (10) is used for estimation, which is suitable if road gradient is considered.

$$E_{brk}(i) = \max\left( (m+m_0)\frac{v(i)^2 - v(i-1)^2}{2} - ((m+m_0)g(h(i)-h(i-1))) - \right. \tag{11}$$

$$At_s \cdot \frac{v(i)+v(i+1)}{2} - Bt_s \cdot \frac{v(i)^2 + v(i+1)^2 + v(i)v(i+1)}{3} -$$

$$\left. Ct_s \cdot \frac{v(i)^3 + v(i)^2 v(i+1) + v(i)v(i+1)^2 + v(i+1)^3}{4}, 0 \right)$$

Based on one of the above formulas (2)-(8) and (9)-(11), for any experimental test, a group of $I_o$, $I_g$, $I_{spd}$, $I_{H-brk}$, $I_{L-brk}$, $I_{AC}$, and $I_{slw}$ can be calculated to be corresponding to ECR. Therefore, by applying formula (1), through multiple trip experiments, $\beta_w$, $\beta_g$, $\beta_{spd}$, $\beta_{H-brk}$, $\beta_{L-brk}$, $\beta_{AC}$ and $\beta_{slw}$ can be acquired by linear regression. $\beta_{AC}$ can be omitted in the absence of high and low temperature test environment.

In some alternative implementations of this embodiment, the above-mentioned execution entity can execute the above-mentioned step 202 in the following way.

The electric vehicle to be analyzed is determined, and the speed, altitude, load and energy consumption information in its actual driving process are collected. The collected data is divided according to the trip. The starting point and the end point of a trip can be defined by user's departure place and destination, or can be distinguished simply based on judgement of long-term parking, load change and other conventional trip cognition rules in the data.

The trip data is cleaned and filtered, and the trip energy consumption rate ECR and the driving features of the trip, $I_o$, $I_g$, $I_{spd}$, $I_{H-brk}$, $I_{L-brk}$, $I_{AC}$, and $I_{slw}$, are calculated. $I_{AC}$ can be omitted in the absence of high and low temperature environment test condition.

In some alternative implementations of this embodiment, the above-mentioned execution entity can execute the above-mentioned step 203 in the following way. The specific calculation is as follows:

the rolling-loss-associated component:

$$ECR_w = \beta_w \cdot I_0 \tag{12}$$

the altitude-change-associated component:

$$ECR_g = \beta_g \cdot I_g \tag{13}$$

the aerodynamic-loss-associated component:

$$ECR_{spd} = \beta_{spd} \cdot I_{spd} \tag{14}$$

the high-speed-braking-loss-associated component:

$$ECR_{Hbrk} = \beta_{H-brk} \cdot I_{H-brk} \tag{15}$$

the low-speed-braking-loss-associated component:

$$ECR_{Lbrk} = \beta_{L-brk} \cdot I_{L-brk} \tag{16}$$

the HVAC-operation-associated component:

$$ECR_{AC} = \beta_{AC} \cdot I_{AC} \tag{17}$$

the ancillary-loss-associated component:

$$ECR_{slw} = \beta_{slw} \cdot I_{slw} \tag{18}$$

If $\beta_{AC}$ is not obtained in the previous steps, the HVAC-operation-associated component of ECR can be obtained by the following methods: 1) reading the energy consumption of ancillaries by the vehicle bus (energy consumption of low-voltage appliances); 2) estimating according to formula (19).

$$ECR_{AC} = \tag{19}$$
$$ECR - ECR_{spd} - ECR_{slw} - ECR_g - ECR_w - ECR_{Hbrk} - ECR_{Lbrk}$$

In some alternative implementations of this embodiment, the above-mentioned execution entity can calculate the evaluation indicators of energy consumption components from different sources in the following ways.

The energy consumption components $ECR_w$, $ECR_g$, $ECR_{spd}$, $ECR_{slw}$, $ECR_{Hbrk}$, $ECR_{Lbrk}$ and $ECR_{AC}$ from different sources are calculated as the evaluation indicators for the distribution of the trip energy consumption source; where $ECR_{spd}$, $ECR_{slw}$, $ECR_{Hbrk}$, $ECR_{Lbrk}$ and $ECR_{AC}$ are used as the evaluation indicators for the influence of the driving behavior on energy consumption.

As an implementation of the method shown in FIG. 1, the present disclosure provides an embodiment of an energy consumption decomposition system of an electric vehicle, which corresponds to the method embodiment shown in FIG. 1. The system can be specifically applied to various electronic devices.

The energy consumption decomposition system of the electric vehicle includes an actual driving data acquiring module, a trip energy consumption rate and driving feature calculation module and an energy consumption decomposition result determining module.

The actual driving data acquiring module is configured to acquire actual driving data of an electric vehicle to be analyzed during a trip, where the actual driving data includes curb weight, loaded mass, trip route information and the total trip energy consumption, and the trip route information includes position data and speed data.

The trip energy consumption rate and driving feature calculation module is configured to determine the trip energy consumption rate and driving features of the trip in the actual trip data, where driving features of the trip are influenced by a single factor or by a plurality of factors; the single factor includes a trip factor or a driving behavior factor; and the plurality of factors include a trip factor and a driving behavior factor.

The energy consumption decomposition result determining module is configured to determine an energy consumption decomposition result of the electric vehicle according to each driving feature and the trip energy consumption rate, where the energy consumption decomposition result at least includes components of the energy consumption rate corresponding to driving features of the trip.

Figure 3:
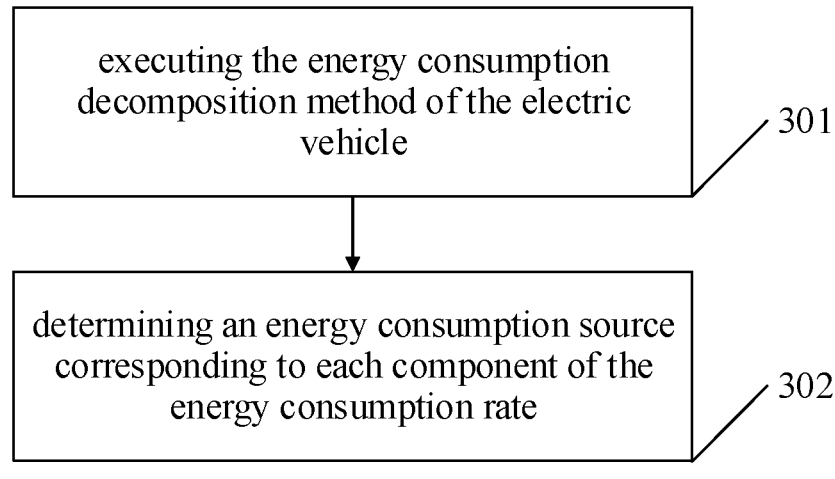
FIG. 3 is a flowchart of an embodiment of an energy consumption analysis method of an electric vehicle according to the present disclosure.

Continue to refer to FIG. 3, which shows a flow 300 of an embodiment of an energy consumption analysis method of an electric vehicle including the following steps:

Step 301: executing the energy consumption decomposition method of the electric vehicle;

Step 302: determining an energy consumption source corresponding to each component of the energy consumption rate.

In this embodiment, the execution entity of the energy consumption analysis method of the electric vehicle is, for example, the terminal device or the server in FIG. 1.

In some alternative implementations of this embodiment, the energy consumption analysis method of the electric vehicle executed by the execution entity further includes determining a target component of the energy consumption rate from the decomposition results, and the energy consumption sources and energy-saving measures corresponding to the target component of the energy consumption rate, where the target component of the energy consumption rate is a component of the energy consumption rate determined by subjective analysis based on the energy consumption rate proportion or cumulative distribution function of each component of the energy consumption rate in combination with application scenarios; alternatively, the target component of the energy consumption rate is a component of the energy consumption rate determined by subjective analysis based on each component of the energy consumption rate in combination with application scenarios.

Subjective analyses are required because the target components are not determined exclusively on the quantitative results of the decomposition approach, but also by considering which components are easier or more feasible for energy consumption optimization in real-world driving scenarios. For example: because when the load intensity corresponded component of energy consumption rate accounts for 40% and the high-speed braking intensity corresponded component of the energy consumption rate accounts for 30%, in this case, subjective analysis of the driver is required, as to necessity to determine the high-speed-braking-intensity corresponded component of the energy consumption rate as the target component of the energy consumption rate, so as to achieve the purpose of energy saving.

In some alternative implementations of this embodiment, the energy consumption analysis method of the electric vehicle executed by the execution entity further includes displaying the target component of the energy consumption rate, and the energy consumption sources and energy-saving measures corresponding to the target component of the energy consumption rate, where the target component of the energy consumption rate is a component of the energy consumption rate determined by subjective analysis based on the energy consumption rate proportion of each component of the energy consumption rate or cumulative distribution function in combination with application scenarios; alternatively, the target component of the energy consumption rate is a component of the energy consumption rate determined by subjective analysis based on each component of the energy consumption rate in combination with application scenarios.

In some alternative implementations of this embodiment, the energy consumption decomposition result includes the rolling-loss-associated component of the energy consumption rate, the aerodynamic-loss-associated component of the energy consumption rate, the high-speed-braking-loss-associated component of the energy consumption rate, the low-speed-braking-loss-associated component of the energy consumption rate, the ancillary-loss-associated component of the energy consumption rate, the altitude-change-associated component of the energy consumption rate, and the HVAC-operation-associated component of the energy consumption rate.

The energy consumption source corresponding to the rolling-loss-associated component of the energy consumption rate includes electric vehicle load and/or electric vehicle tires; the energy consumption source corresponding to the aerodynamic-loss-associated component of the energy consumption rate includes wind speed, vehicle aerodynamic resistance and/or vehicle speed during driving of the electric vehicle; the energy consumption source corresponding to the high-speed-braking-loss-associated component of the energy consumption rate includes braking operation during high-speed driving of the electric vehicle; the energy consumption source corresponding to the low-speed-braking-loss-associated component of the energy consumption rate includes braking operation during low-speed driving of the electric vehicle; the energy consumption source corresponding to the ancillary-loss-associated component of the energy consumption rate includes idle duration of the electric vehicle and/or ancillary power; the energy consumption source corresponding to the altitude-change-associated component of the energy consumption rate includes altitude change during driving of the electric vehicle; the energy consumption source corresponding to the HVAC-operation-associated component of the energy consumption rate includes the HVAC power of the electric vehicle, HVAC operation of a driver and/or ambient temperature.

In some alternative implementations of this embodiment, the energy consumption decomposition result includes the rolling-loss-associated component of the energy consumption rate, the aerodynamic-loss-associated component of the energy consumption rate, the high-speed-braking-loss-associated component of the energy consumption rate, the low-speed-braking-loss-associated component of the energy consumption rate, the ancillary-loss-associated component of the energy consumption rate, the altitude-change-associated component of the energy consumption rate, and the HVAC-operation-associated component of the energy consumption rate.

The energy-saving measures corresponding to the rolling-loss-associated component of energy consumption rate include reducing load, reducing loading hours and/or using low rolling resistance tires; the energy-saving measures corresponding to the aerodynamic-loss-associated component of the energy consumption rate include slowing down high-speed driving and/or optimizing vehicle aerodynamic resistance; the energy-saving measures corresponding to the high-speed-braking-loss-associated component of the energy consumption rate include reducing or slowing down braking operation at high speed; the energy-saving measures corresponding to the low-speed-braking-loss-associated component of the energy consumption rate include reducing and slowing down braking operation at low speed and/or optimizing the trip route of the electric vehicle; the energy-saving measures corresponding to the ancillary-loss-associated component of the energy consumption rate include reducing idle duration of the vehicle and/or reducing the frequency and duration at which high-power ancillaries are used; the energy-saving measures corresponding to the altitude-change-associated component of the energy consumption rate include optimizing the trip route of the electric vehicle; the energy-saving measures corresponding to the HVAC-operation-associated component of the energy consumption rate include reducing the operating time of the HVAC and/or reducing the set temperature of the HVAC.

In some alternative implementations of this embodiment, the above-mentioned execution entity can analyze the energy consumption of the electric vehicle through three methods. The three methods can be used together or only one of the three methods is used according to different application scenarios.

A First Method: Energy Saving Analysis by Horizontal Comparison $ECR_w$, $ECR_g$, $ECR_{spd}$, $ECR_{stw}$, $ECR_{Hbrk}$, $ECR_{Lbrk}$ and $ECR_{AC}$ are obtained by decomposing the data of a certain trip, and the proportion of the above components in the total energy consumption rate ECR is calculated. According to the proportion, the energy-saving potential of different factors is analyzed (for example, the components with high proportion represent the energy consumption of the main factors influencing the trip, and it is more effective to pay attention to the corresponding energy-saving measures in this trip). The main factors that need to be considered in energy saving during this trip can be obtained, and the correspondence between the specifically decomposed components of the energy consumption rate and energy saving suggestions is shown in Table 1.

TABLE 1

| the correspondence between the decomposed components of the energy consumption rate, sources and energy saving suggestions | | |
|---|---|---|
| comparing CDF results | energy consumption sources | Suggestions |
| $ECR_w$ is high | load, tires | Reducing the load or reducing the loading hours, and adopting a low rolling resistance tire. |
| $ECR_g$ is high | uphill | There are many uphill sections, optimization of trip planning can be considered. |
| $ECR_{spd}$ is high | wind speed, vehicle speed | Reducing aggressive driving, and slowing down the vehicle speed. |
| $ECR_{stw}$ is high | idling | Pay attention to reducing the idle duration of vehicles. |

TABLE 1-continued the correspondence between the decomposed components of the energy
consumption rate, sources and energy saving suggestions

| comparing CDF results | energy consumption sources | Suggestions |
|---|---|---|
| $ECR_{Hbrk}$ is high | braking in the case of driving on a unhindered road | Reducing aggressive driving, and reducing situations of braking at a high speed. |
| $ECR_{Lbrk}$ is high | braking in the case of driving at a low speed | Reducing frequent braking in congestion, or avoiding congested road sections. |
| $ECR_{AC}$ is high | HVAC | Adjusting the set temperature of the HVAC or turning off the HVAC for a certain period of time. |

A Second Method: Energy Saving Analysis by Longitudinal Comparison

For each vehicle type, a certain amount of trip data is collected. The decomposed $ECR_w$, $ECR_g$, $ECR_{spd}$, $ECR_{stw}$, $ECR_{Hbrk}$, $ECR_{Lbrk}$ and $ECR_{AC}$ are subject to longitudinal comparison as historical data, and the cumulative distribution functions (CDF) of these components are calculated, respectively. These CDFs can be constant or updated by offline or online methods, to improve the rationality of the CDF. According to corresponding probability of ECRw, ECRg, ECRspd, ECRstw, ECRHbrk, ECRLbrk and ECRAC of the trip to be estimated, in CDF, the energy-saving potential of different factors is analyzed according to the probability (for example, the high cumulative probability indicates a high energy-saving potential). The correspondence between the specifically decomposed components of the energy consumption rate and energy saving suggestions is shown in Table 1.

A Third Method: Vehicle Model Selection Analysis

According to the values of $\beta_w$, $\beta_g$, $\beta_{spd}$, $\beta_{H-brk}$, $\beta_{L-brk}$, $\beta_{AC}$ and $\beta_{stw}$, the energy saving level of two or more different vehicle models is compared, and the item with larger $\beta_w$ corresponds to a larger energy consumption. According to the proportional distribution of $ECR_w$, $ECR_g$, $ECR_{spd}$, $ECR_{stw}$, $ECR_{Hbrk}$, $ECR_{Lbrk}$ and $ECR_{Ac}$ in the trip, in combination with formula (1), the influence weight coefficient of the above parameters on the total trip energy consumption can be determined. For vehicle model selection, the principle that the $ECR_x$ ratio is relatively large and Bx is relatively small can be used as the selection principle of energy-saving vehicles for one or more specific trips. When the selection model $\beta_x$ is unknown, also with reference to Table 1, vehicle models with superior energy-saving relevant parameters for components with a larger proportion are selected.

The application of the present disclosure is illustrated hereinafter.

Example 1: Examples of Decomposition Results and Decomposition Results by Horizontal Comparison An electric vehicle records the energy consumption of a trip, and the total trip energy consumption rate is shown in the left histogram in FIG. 4 (abscissa: a common method). The total energy consumption rate is the data used by a common energy consumption analysis system. It can be seen that it is difficult for users to understand how to further save energy only by obtaining the total energy consumption.

Figure 4:
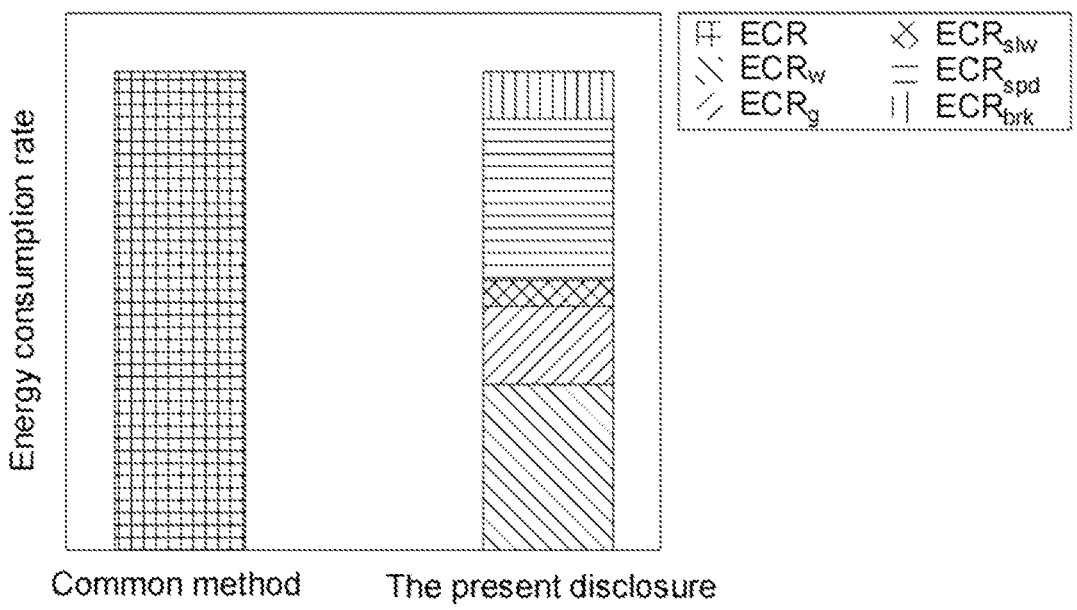
FIG. 4 is a comparison diagram between total energy consumption and energy consumption decomposition according to an embodiment of the present disclosure.
Figure 5:
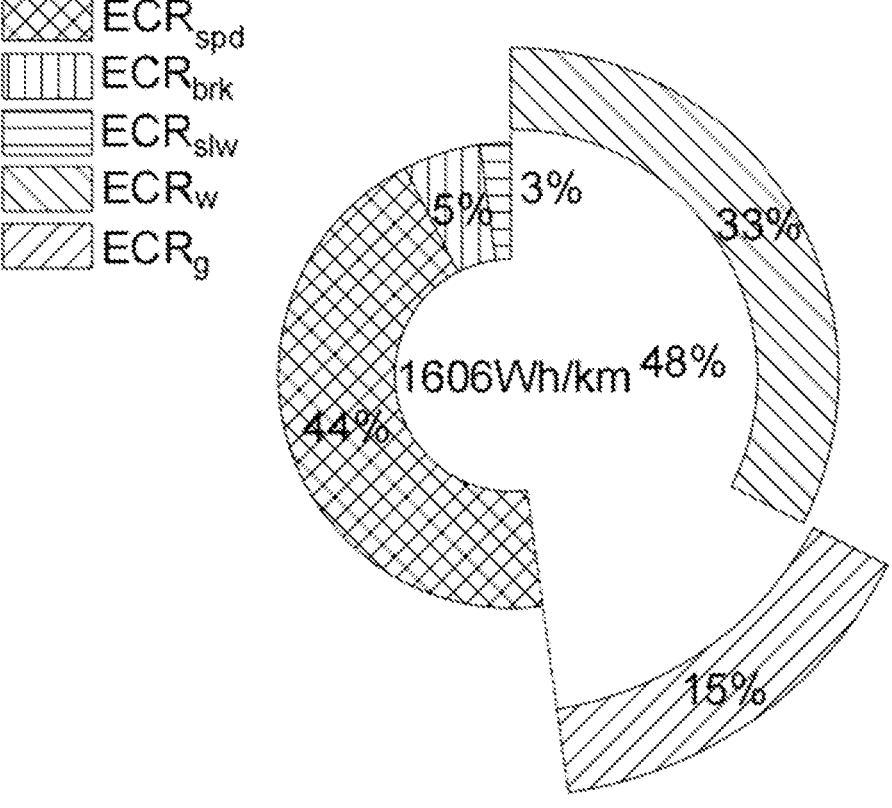
FIG. 5 is a pie chart showing each energy consumption proportion after applying decomposition of the disclosure according to an embodiment of the present disclosure.
Figure 6:
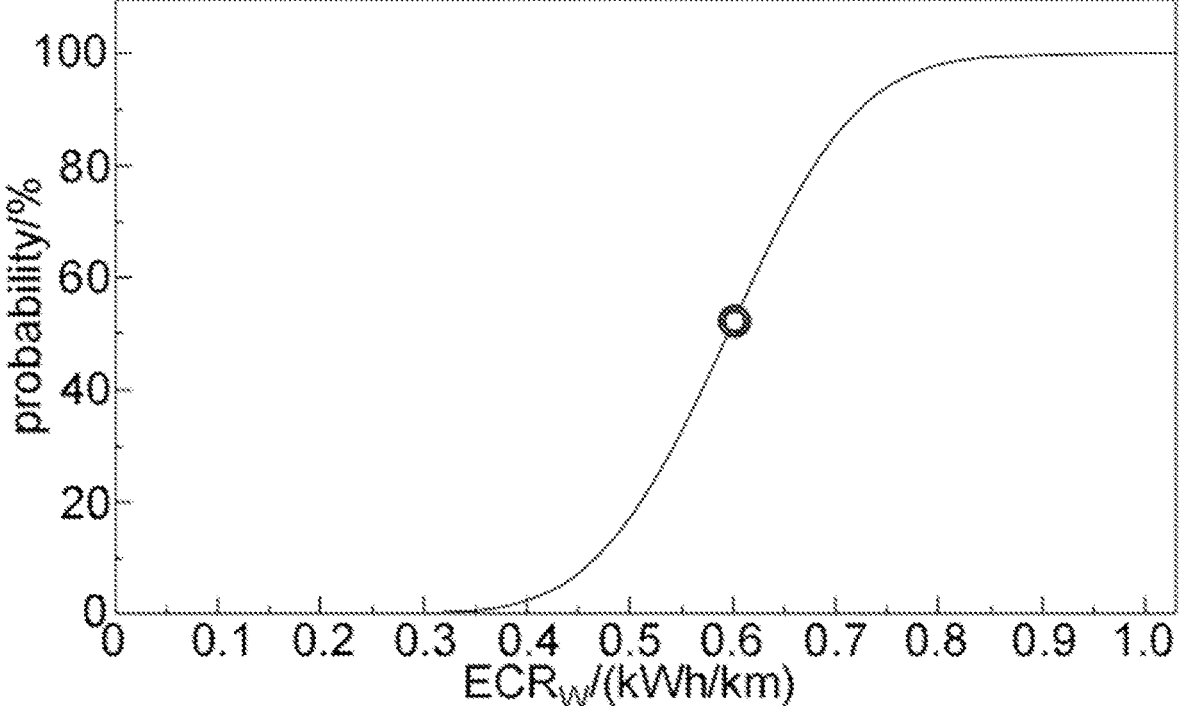
FIG. 6 is a schematic diagram showing longitudinal comparison between the rolling-loss-associated component decomposed from a trip and the rolling-loss-associated component decomposed from historical trips, by applying the disclosure according to an embodiment of the present disclosure.
Figure 7:
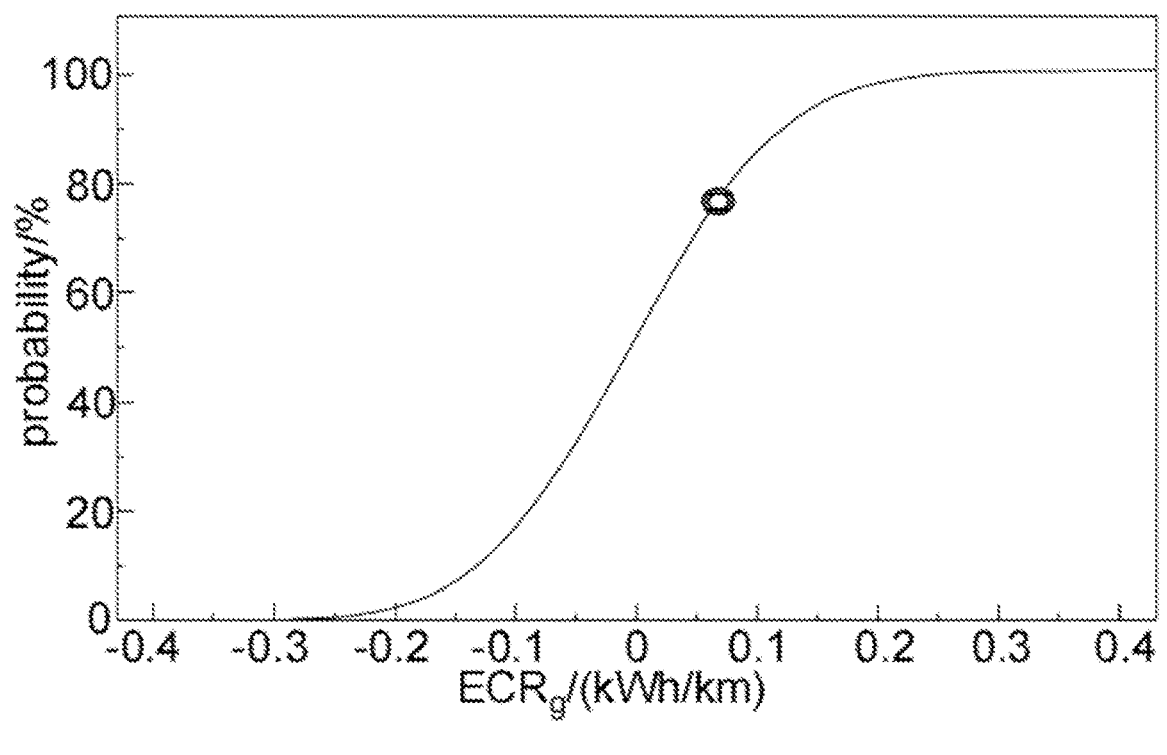
FIG. 7 is a schematic diagram showing longitudinal comparison between the altitude-change-associated component decomposed from a trip and the altitude-change associated component decomposed from historical trips, by applying the disclosure according to an embodiment of the present disclosure.
Figure 8:
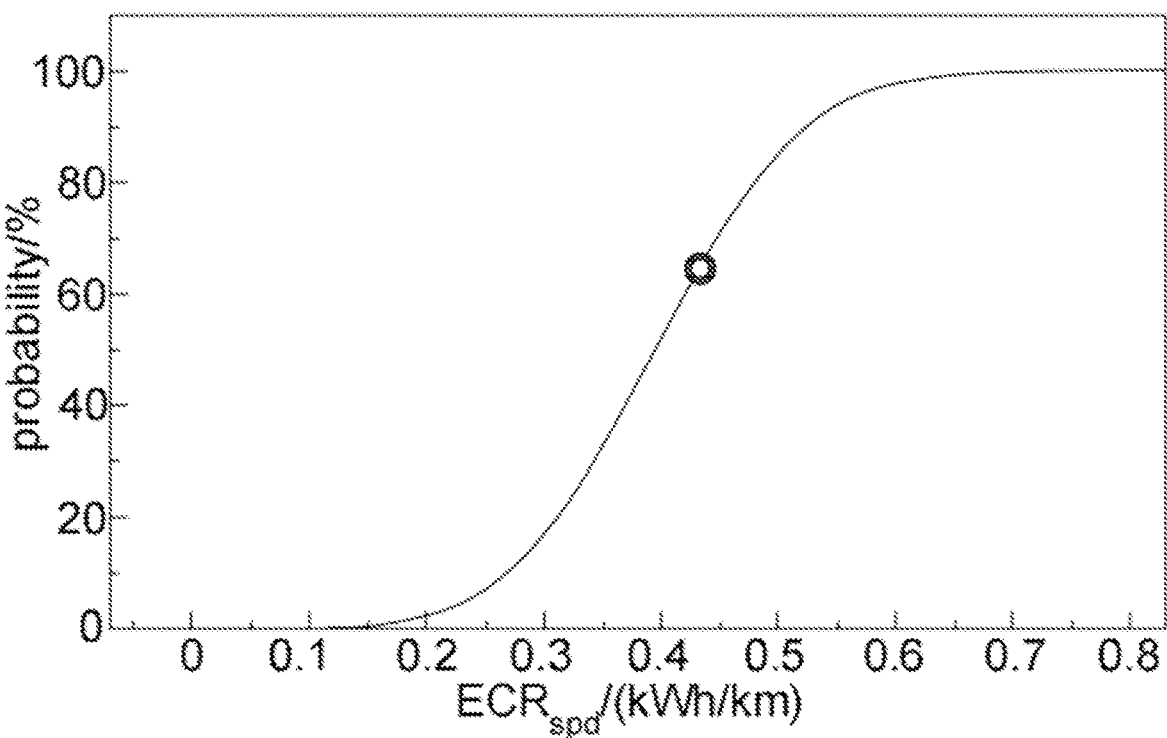
FIG. 8 is a schematic diagram showing longitudinal comparison between the aerodynamic-loss-associated component decomposed from a trip and the aerodynamic-loss associated component decomposed from historical trips, by applying the disclosure according to an embodiment of the present disclosure.
Figure 9:
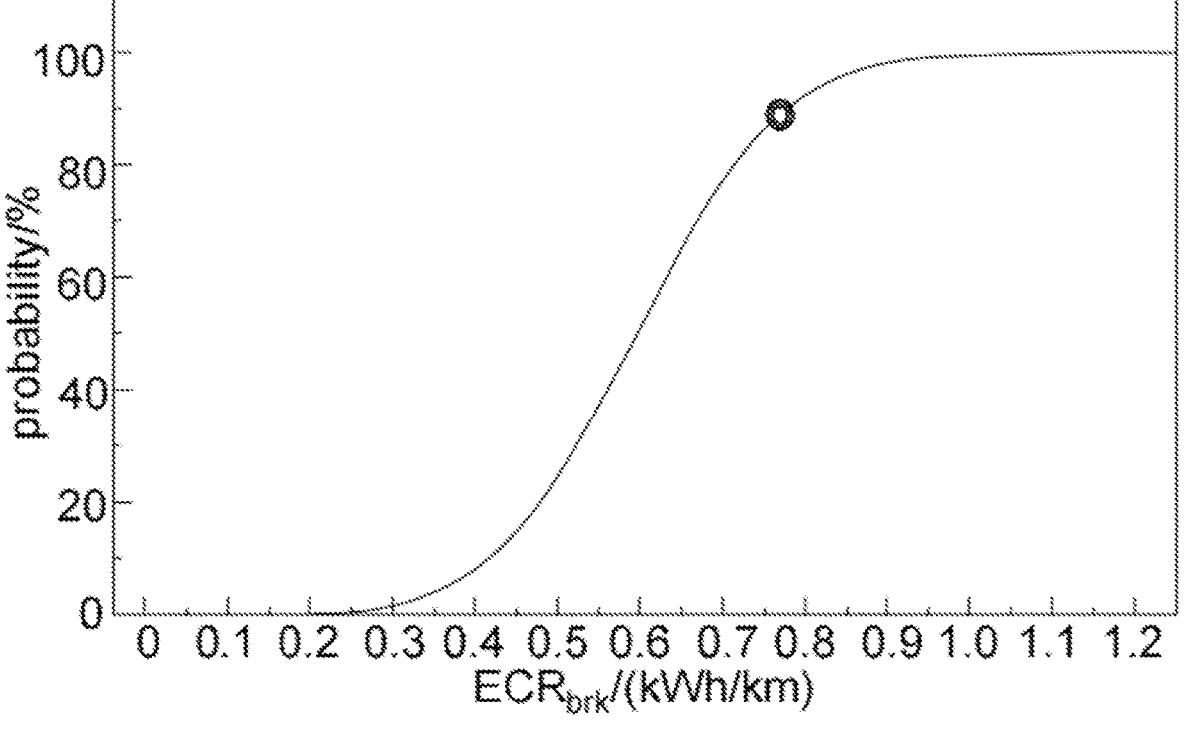
FIG. 9 is a schematic diagram showing longitudinal comparison between the braking-loss-associated component decomposed from a trip and the braking-loss-associated component decomposed from historical trips, by applying the disclosure according to an embodiment of the present disclosure.
Figure 10:
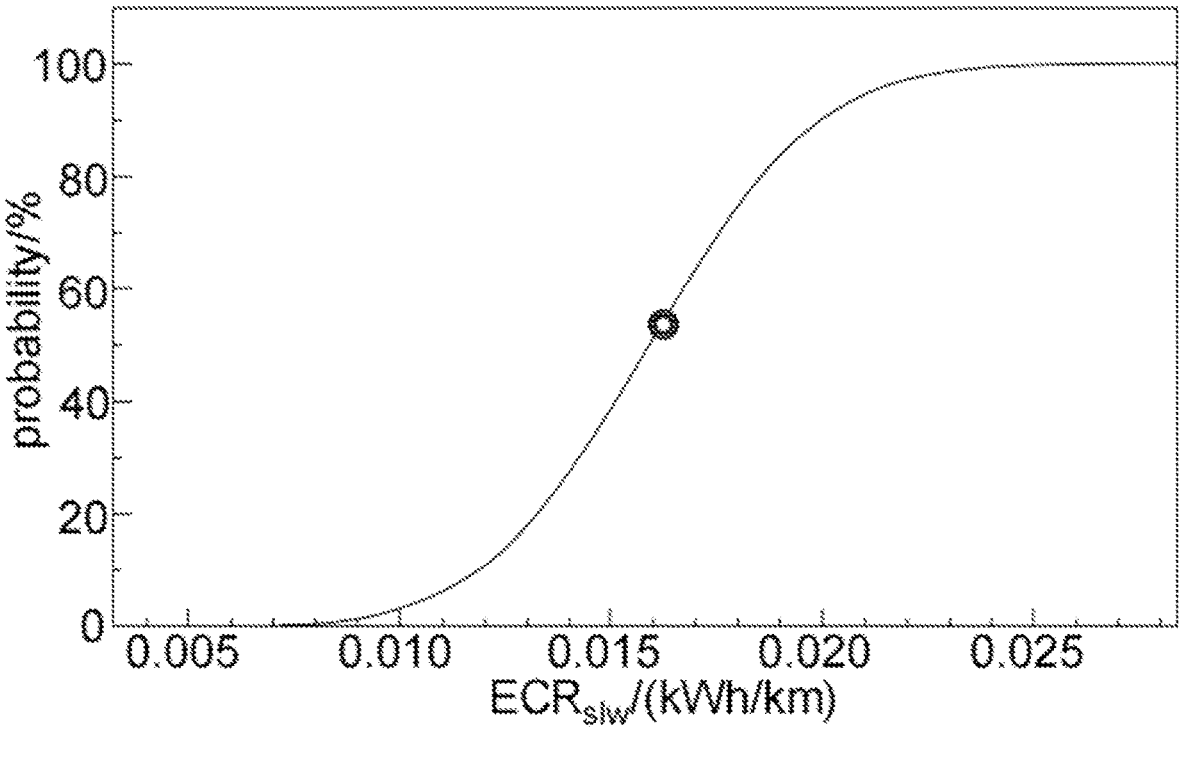
FIG. 10 is a schematic diagram showing longitudinal comparison between the ancillary-loss-associated component decomposed from a trip and the ancillary-loss-associated component decomposed from historical trips, by applying the disclosure according to an embodiment of the present disclosure.

The present disclosure uses the driving data of a trip to decompose the total energy consumption rate into five parts $ECR_w$, $ECR_g$, $ECR_{spd}$, $ECR_{stw}$, and $ECR_{brk}$ corresponding to the five colors in FIG. 4 (abscissa: the present disclosure) according to the source of energy consumption, where $ECR_{brk}=ECR_{Hbrk}+ECR_{Lbrk}$ is the total braking intensity, which does not consider the energy consumption of the HVAC due to driving at normal temperature, and the formula is only used for illustration by simplification. The proportions of different components are calculated by horizontal comparison, and the result is shown in FIG. 5. Therefore, it can be seen that the biggest energy-saving potential of the trip lies in $ECR_{spd}$. If the speed intensity is reduced by 20% (reducing driving speed), the total energy consumption will be reduced by 44% *20%=8.8%. Secondly, reducing the load of the vehicle or replacing low rolling resistance tires will also have a significant energy-saving effect, and other measures may not have a significant influence on the trip.

Example 2: Examples of Vehicle Model Selection

For the trip in Example 1, it can be seen that the energy consumption of the vehicle in $ECR_{spd}$ accounts for a significant proportion, so that in vehicle model selection, vehicles with smaller Bspd can be selected, or vehicles with smaller aerodynamic resistance can be selected directly through physical significance.

Example 3: Examples of Decomposition Results and Energy Saving Analysis by Longitudinal Comparison According to the present disclosure, the CDF of five components of the energy consumption rate can be obtained by counting the historical data of a certain vehicle model, as shown in FIG. 6 to FIG. 10, including: $ECR_w$, $ECR_g$, $ECR_{spd}$, $ECR_{stw}$, and $ECR_{brk}$, where $ECR_{brk}=ECR_{Hbrk}+ECR_{Lbrk}$ is the total braking intensity, which does not consider the energy consumption of the HVAC due to driving at normal temperature, and the formula is only used for illustration by simplification. The energy consumption of a certain trip is also decomposed into five components by using the present disclosure, and corresponding probability in CDF is marked on the CDF in FIG. 6 with a circle. It can be seen from the figures that the $ECR_{brk}$ of the trip corresponds to a very high CDF, indicating that the braking of the trip is more frequent or intensive than that of the historical trip, so that drivers are advised to drive gently and reduce frequent braking. The so-called "longitudinal comparison" refers to comparison with historical data, the curved line shown in each of FIG. 6 to FIG. 10 indicates a historical CDF, and the circle in each figure indicates a value obtained from the trip. From the position of the value of the trip in the historical distribution, it can be seen whether corresponding component is high or low in the trip.

Example 4: Rationalize Driving Behavior Assessments

In order to achieve energy saving and emission reduction, the energy consumption level of drivers is often linked to their performance in bus management to encourage drivers to drive in an energy-saving way. However, if the bus carries more passengers than usual, it will also result in an increase in energy consumption, which is unreasonable to be attributable to the driving of drivers. This problem can be solved by decomposing the trip energy consumption of the bus by using the present disclosure. If the high energy consumption rate is mainly resulted from a large ECRw, it has nothing to do with the driving behavior of drivers. If the high energy consumption rate is mainly resulted from ECRspd, ECRstw and ECRbrk, it indicates insufficient energy-saving driving by the driver.

As an implementation of the method shown in FIG. 3, the present disclosure provides an embodiment of an energy consumption analysis system for electric vehicles. The system embodiment corresponds to the method embodiment shown in FIG. 3. The system can be specifically applied to various electronic devices.

The energy consumption analysis system for an electric vehicle includes:

an executing module, which is configured to execute the energy consumption decomposition method for an electric vehicle;

an energy consumption source determining module, which is configured to determine the energy consumption source corresponding to each component of the energy consumption rate.

As an implementation of the above methods shown in FIGS. 1 and 3, the present disclosure provides an embodiment of an electronic device. The electronic device includes a memory and a processor, where the memory is configured to store a computer program, and the processor runs the computer program so that the electronic device executes the energy consumption decomposition method of the electric vehicle or the energy consumption analysis method of the electric vehicle.

For example, the electronic device is a smart phone. The smart phone executes the energy consumption decomposition method of the electric vehicle or the energy consumption analysis method of the electric vehicle, determines that it is possible to comprehensively analyze the energy consumption decomposition of vehicles, enables users to know to which degree the trip factor and the driving behavior factor influence energy consumption, so as to achieve the purpose of energy saving.

As an implementation of the methods shown in FIGS. 1 and 3, the present disclosure provides an embodiment of a computer-readable storage medium. A computer program is stored in the computer-readable storage medium. The computer program, when executed by a processor, implements the energy consumption decomposition method of the electric vehicle or the energy consumption analysis method of the electric vehicle.

The computer-readable medium may be included in the device described in the above embodiments, or exists alone without being assembled into the device.

At present, there is no way to decompose and trace the trip energy consumption of the electric vehicle, to enable users to know to which degree the trip factor and the driving behavior factor influence energy consumption. In particular, the energy consumption of different parts in the vehicle involves some internal parameters and variables in the vehicle that users cannot acquire, which further increases the difficulty of decomposing and tracing the energy consumption of the vehicle. The present disclosure provides a method of decomposing trip energy consumption of the vehicle through the data analysis algorithm without additional acquisition of internal parameters and variables in the vehicle, which directly provides the influence of the driving behavior of the driver (including vehicle load and other behaviors) and the trip path on the trip energy consumption. The output result of the method has clear physical meaning and is easy to be visualized, which not only can be directly embedded in a vehicle-mounted human-computer interaction system to provide users with trip path planning and energy-saving driving suggestions, but also can be used for unified scheduling of large-scale transportation systems such as public transportation and logistics, so as to realize the evaluation of the driving energy efficiency of the drivers of the fleet and the overall energy efficiency optimization of the fleet.

Differences: the existing related patent methods mainly estimate the total trip energy consumption rate by extracting and combining the trip characteristics. In the present disclosure, the total trip energy consumption rate is adopted and its main components are decomposed. Purpose: the existing related patents mainly aim at the prediction and evaluation of the energy consumption of the vehicle, and the estimation, prediction and evaluation objects are vehicles. The present disclosure mainly aims at the use of vehicles by users, including the driving behavior, the trip path and the vehicle model selection, and provides suggestions for the driving, the trip planning and the vehicle model selection of users by extracting their significant characterization parameters influencing energy consumption.

The difference between this method and other driving behavior energy-saving algorithms is that the existing driving behavior energy-saving algorithms cannot quantify the relationship between the driving behavior and the energy consumption, and the physical meaning is unclear. For example, only information such as user being in aggressive driving is given, but the influence degree of aggressive driving on energy consumption and the meaning of the degree of aggressive driving are unclear. The present disclosure allows users to directly acquire the proportion of energy consumption resulted from speed, braking and other factors in the trip, which is clear and accurate.

In this specification, various embodiments are described in a progressive way. Each embodiment emphasizes on differences from other embodiments, and the same and similar parts in various embodiments can be referred to each other. Since the system disclosed in the embodiment corresponds to the method disclosed in the embodiment, the system is described simply. For relevant portions, please refer to the description of the method.

As used herein, the term "and/or" includes any and all combinations of one or more of the associated listed items. Further, the singular forms and the articles "a", "an", and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening element may be present.

In the present disclosure, specific examples are used to illustrate the principle and implementation of the present disclosure, and the explanations of the above embodiments are only used to help understand the method and core ideas of the present disclosure. For those skilled in the art, there will be some changes in the specific implementation and application scope based on the idea of the present disclosure. To sum up, the contents of the description shall not be construed as limiting the present disclosure.

What is claimed is:

1. An energy consumption decomposition method of an electric vehicle, comprising:

acquiring, by a processor, actual driving data of the electric vehicle to be analyzed during a trip, wherein the actual driving data comprises curb weight, load mass, trip route information and total trip energy consumption, and the trip route information comprises position data and speed data;

determining, by the processor, a trip energy consumption rate and driving features of the trip in the actual driving data, wherein the driving features of the trip are influenced by a trip factor or a driving behavior factor;

determining, by the processor, an energy consumption decomposition result of the electric vehicle according to the driving features and the trip energy consumption rate, wherein the energy consumption decomposition result at least comprises a component of the trip energy consumption rate corresponding to each driving feature of the trip, wherein the energy consumption decomposition result comprises a rolling-loss-associated component of the trip energy consumption rate, an aerodynamic-loss-associated component of the trip energy consumption rate, a high-speed-braking-loss-associated component of the trip energy consumption rate, a low-speed-braking-loss-associated component of the trip energy consumption rate, an ancillary-loss-associated component of the trip energy consumption rate, an altitude-change-associated component of the trip energy consumption rate, and an HVAC-operation-associated component of the trip energy consumption rate;

presenting the energy consumption decomposition result of the electric vehicle on a human-computer interaction interface, and receiving a selection about a target component of the trip energy consumption rate by a user from the energy consumption decomposition result on the human-computer interaction interface; and in responding to the selection, presenting an energy consumption source and an energy-saving measure corresponding to the target component on the human-computer interaction interface, wherein in responding to the altitude-change-associated component being selected as the target component, a route in the trip route information of the trip is changed to be a route with least uphill sections among available routes of the trip; or in responding to the HVACoperation-associated component being selected as the target component, a set temperature of an HVAC is adjusted to reduce a difference between the set temperature of the HVAC and an ambient temperature or the HVAC is turned off for a preset period.

2. The energy consumption decomposition method of the electric vehicle according to claim 1, wherein the driving features of the trip comprise load intensity, climbing intensity, speed intensity, high-speed braking intensity, low-speed braking intensity, HVAC usage intensity influenced by the driving behavior factor and slow-driving intensity; or, the driving features of the trip comprise load intensity, climbing intensity, speed intensity, high-speed braking intensity, low-speed braking intensity and slow-driving intensity, wherein the slow-driving intensity is calculated as follows:

$$I_{slw} = \frac{1}{\bar{v}_{trip}},$$

wherein $I_{slw}$ indicates the slow-driving intensity, and $\bar{v}_{trip}$ indicates an average speed in the trip;

wherein the driving features of load intensity, high-speed braking intensity, low-speed braking intensity and slow-driving intensity are influenced by the driving behavior factor, wherein the driving feature of climbing intensity is influenced by the trip factor, wherein the driving feature of speed intensity is influenced by the trip factor and the driving behavior factor, and wherein a low speed is a speed less than a predetermined threshold speed, a high speed is a speed greater than or equal to the predetermined threshold speed.

3. The energy consumption decomposition method of the electric vehicle according to claim 2, wherein, the rolling-loss-associated component of the trip energy consumption rate is determined according to the load intensity and a weight coefficient corresponding to the load intensity;

the aerodynamic-loss-associated component of the trip energy consumption rate is determined according to the speed intensity and a weight coefficient corresponding to the speed intensity;

the high-speed-braking-loss-associated component of the trip energy consumption rate is determined according to the high-speed braking intensity and a weight coefficient corresponding to the high-speed braking intensity;

the low-speed-braking-loss-associated component of the trip energy consumption rate is determined according to the low-speed braking intensity and a weight coefficient corresponding to the low-speed braking intensity;

the ancillary-loss-associated component of the trip energy consumption rate is determined according to the slow-driving intensity and a weight coefficient corresponding to the slow-driving intensity;

the altitude-change-associated component of the trip energy consumption rate is determined according to the climbing intensity and a weight coefficient corresponding to the climbing intensity; and the HVAC-operation-associated component of the trip energy consumption rate is determined according to the HVAC usage intensity and a weight coefficient corresponding to the HVAC usage intensity, if the driving features of the trip comprise the HVAC usage intensity; and the HVAC-operation-associated component of the trip energy consumption rate is obtained by subtracting a component of the trip energy consumption rate corresponding to each driving feature of the trip from the trip energy consumption rate, if the driving features of the trip do not comprise the HVAC usage intensity.

4. The energy consumption decomposition method of the electric vehicle according to claim 3, wherein weight coefficients respectively corresponding to the driving features are obtained through a parameter learning experiment of an energy consumption decomposition algorithm, and wherein the parameter learning experiment of the energy consumption decomposition algorithm comprises:

determining an actual driving data and a total trip energy consumption of an experimental electric vehicle in each of experimental trips of a laboratory test and an actual road driving test through the laboratory test or the actual road driving test, wherein the actual driving data in each of the experimental trips is experimental driving data;

calculating a trip energy consumption rate and driving features of each of the experimental trips in the experimental driving data; and determining the weight coefficients of the driving features in an energy consumption model by using linear regression, with the trip energy consumption rate in each of the experimental trips as observations of a response in the energy consumption model, and with the driving features in each of the experimental trips as observations of explanatory variables in the energy consumption model.

5. An energy consumption analysis method of the electric vehicle, comprising:

executing the energy consumption decomposition method of the electric vehicle according to claim 4, and determining the energy consumption source corresponding to each component of the trip energy consumption rate.

6. An electronic device, comprising a human-computer interaction interface, a memory and a processor, wherein the memory is configured to store a computer program, and the processor runs the computer program so that the electronic device executes the method according to claim 5.

7. An energy consumption analysis method of the electric vehicle, comprising:

executing the energy consumption decomposition method of the electric vehicle according to claim 3, and determining the energy consumption source corresponding to each component of the trip energy consumption rate.

8. An electronic device, comprising a human-computer interaction interface, a memory and a processor, wherein the memory is configured to store a computer program, and the processor runs the computer program so that the electronic device executes the method according to claim 7.

9. An energy consumption analysis method of the electric vehicle, comprising:

executing the energy consumption decomposition method of the electric vehicle according to claim 2, and determining the energy consumption source corresponding to each component of the trip energy consumption rate.

10. An electronic device, comprising a human-computer interaction interface, a memory and a processor, wherein the memory is configured to store a computer program, and the processor runs the computer program so that the electronic device executes the method according to claim 9.

11. An energy consumption analysis method of the electric vehicle, comprising:

executing the energy consumption decomposition method of the electric vehicle according to claim 1, and determining the energy consumption source corresponding to each component of the trip energy consumption rate.

12. The energy consumption analysis method of the electric vehicle according to claim 11, further comprising:

determining the target component of the trip energy consumption rate from the energy consumption decomposition result; and determining the energy consumption source and an energy-saving measure corresponding to the target component of the trip energy consumption rate, wherein the target component of the trip energy consumption rate is a component of the trip energy consumption rate determined by subjective analysis based on an energy consumption rate proportion or a cumulative distribution function of each component of the trip energy consumption rate in combination with application scenarios; or, the target component of the trip energy consumption rate is a component of the trip energy consumption rate determined by subjective analysis based on each component of the trip energy consumption rate in combination with application scenarios.

13. The energy consumption analysis method of the electric vehicle according to claim 12, wherein, the energy consumption source corresponding to the rolling-loss-associated component of the trip energy consumption rate comprises an electric vehicle load or electric vehicle tires;

the energy consumption source corresponding to the aerodynamic-loss-associated component of the trip energy consumption rate comprises at least one of wind speed, vehicle aerodynamic resistance and vehicle speed during driving of the electric vehicle;

the energy consumption source corresponding to the high-speed-braking-loss-associated component of the trip energy consumption rate comprises braking operation during high-speed driving of the electric vehicle;

the energy consumption source corresponding to the low-speed-braking-loss-associated component of the trip energy consumption rate comprises braking operation during low-speed driving of the electric vehicle;

the energy consumption source corresponding to the ancillary-loss-associated component of the trip energy consumption rate comprises idle duration of the electric vehicle or and/or ancillary power;

the energy consumption sources corresponding to the altitude-change-associated component of the trip energy consumption rate comprises altitude change during driving of the electric vehicle; and the energy consumption source corresponding to the HVAC-operation-associated component of the trip energy consumption rate comprises at least one of HVAC power of the electric vehicle, HVAC operation of a driver and ambient temperature, wherein a low speed is a speed less than a predetermined threshold speed, a high speed is a speed greater than or equal to the predetermined threshold speed.

14. The energy consumption analysis method of the electric vehicle according to claim 12, wherein,

an energy-saving measure corresponding to the rolling-loss-associated component of the trip energy consumption rate comprises at least one of reducing load and reducing loading hours;

an energy-saving measure corresponding to the aerodynamic-loss-associated component of the trip energy consumption rate comprises slowing down high-speed driving or optimizing vehicle aerodynamic resistance;

an energy-saving measure corresponding to the high-speed-braking-loss-associated component of the trip energy consumption rate comprises reducing or slowing down braking operation at high speed;

an energy-saving measure corresponding to the low-speed-braking-loss-associated component of the trip energy consumption rate comprises reducing and slowing down braking operation at low speed or optimizing a trip route of the electric vehicle;

an energy-saving measure corresponding to the ancillary-loss-associated component of the trip energy consumption rate comprises reducing idle duration of the electric vehicle;

an energy-saving measure corresponding to the altitude-change-associated component of the trip energy consumption rate comprises optimizing the trip route of the electric vehicle; and an energy-saving measure corresponding to the HVAC-operation-associated component of the trip energy consumption rate comprises reducing operating hours of the HVAC or adjusting the set temperature of the HVAC to reduce a difference between the set temperature of the HVAC and an ambient temperature, wherein a low speed is a speed less than a predetermined threshold speed, a high speed is a speed greater than or equal to the predetermined threshold speed.

15. The energy consumption analysis method of the electric vehicle according to claim 11, wherein, the energy consumption source corresponding to the rolling-loss-associated component of the trip energy consumption rate comprises an electric vehicle load or electric vehicle tires;

the energy consumption source corresponding to the aerodynamic-loss-associated component of the trip energy consumption rate comprises at least one of wind speed, vehicle aerodynamic resistance and vehicle speed during driving of the electric vehicle;

the energy consumption source corresponding to the high-speed-braking-loss-associated component of the trip energy consumption rate comprises braking operation during high-speed driving of the electric vehicle;

the energy consumption source corresponding to the low-speed-braking-loss-associated component of the trip energy consumption rate comprises braking operation during low-speed driving of the electric vehicle;

the energy consumption source corresponding to the ancillary-loss-associated component of the trip energy consumption rate comprises idle duration of the electric vehicle or ancillary power;

the energy consumption sources corresponding to the altitude-change-associated component of the trip energy consumption rate comprises altitude change during driving of the electric vehicle; and the energy consumption source corresponding to the HVAC-operation-associated component of the trip energy consumption rate comprises at least one of HVAC power of the electric vehicle, HVAC operation of a driver and ambient temperature, wherein a low speed is a speed less than a predetermined threshold speed, a high speed is a speed greater than or equal to the predetermined threshold speed.

16. The energy consumption analysis method of the electric vehicle according to claim 11, wherein, an energy-saving measure corresponding to the rolling-loss-associated component of the trip energy consumption rate comprises at least one of reducing load and reducing loading hours;

an energy-saving measure corresponding to the aerodynamic-loss-associated component of the trip energy consumption rate comprises slowing down high-speed driving or optimizing vehicle aerodynamic resistance;

an energy-saving measure corresponding to the high-speed-braking-loss-associated component of the trip energy consumption rate comprises reducing or slowing down braking operation at high speed;

an energy-saving measure corresponding to the low-speed-braking-loss-associated component of the trip energy consumption rate comprises reducing and slowing down braking operation at low speed or optimizing a trip route of the electric vehicle;

an energy-saving measure corresponding to the ancillary-loss-associated component of the trip energy consumption rate comprises reducing idle duration of the electric vehicle;

an energy-saving measure corresponding to the altitude-change-associated component of the trip energy consumption rate comprises optimizing the trip route of the electric vehicle; and an energy-saving measure corresponding to the HVAC-operation-associated component of the trip energy consumption rate comprises reducing operating hours of the HVAC or reducing the set temperature of the HVAC, wherein a low speed is a speed less than a predetermined threshold speed, a high speed is a speed greater than or equal to the predetermined threshold speed.

17. An electronic device, comprising a human-computer interaction interface, a memory and a processor, wherein the memory is configured to store a computer program, and the processor runs the computer program so that the electronic device executes the method according to claim 11.

18. An electronic device, comprising a human-computer interaction interface, a memory and a processor, wherein the memory is configured to store a computer program, and the processor runs the computer program so that the electronic device executes the energy consumption decomposition method of the electric vehicle according to claim 1.

19. A non-transitory computer-readable storage medium, wherein a computer program is stored therein, the computer program, when executed by a processor, implements the energy consumption decomposition method of the electric vehicle according to claim 1.

* * * * *